(12) United States Patent
Long

(10) Patent No.: US 11,374,026 B2
(45) Date of Patent: Jun. 28, 2022

(54) TFT ARRAY SUBSTRATE AND MANUFACTURING METHOD THEREOF

(71) Applicant: TCL CHINA STAR OPTOELECTRONICS TECHNOLOGY CO., LTD., Shenzhen (CN)

(72) Inventor: Fen Long, Shenzhen (CN)

(*) Notice: Subject to any disclaimer, the term of this patent is extended or adjusted under 35 U.S.C. 154(b) by 139 days.

(21) Appl. No.: 16/757,420

(22) PCT Filed: Jan. 13, 2020

(86) PCT No.: PCT/CN2020/071643
§ 371 (c)(1),
(2) Date: Apr. 20, 2020

(87) PCT Pub. No.: WO2021/128508
PCT Pub. Date: Jul. 1, 2021

(65) Prior Publication Data
US 2021/0408069 A1    Dec. 30, 2021

(30) Foreign Application Priority Data

Dec. 25, 2019   (CN) .......................... 201911361094.4

(51) Int. Cl.
*H01L 27/12*   (2006.01)
(52) U.S. Cl.
CPC ........ *H01L 27/1222* (2013.01); *H01L 27/127* (2013.01); *H01L 27/1288* (2013.01)

(58) Field of Classification Search
CPC .............. H01L 27/1222; H01L 27/127; H01L 27/1288; H01L 29/78669
See application file for complete search history.

(56) References Cited

U.S. PATENT DOCUMENTS

| 5,057,889 A | 10/1991 | Yamada et al. |
| 5,091,337 A | 2/1992 | Watanabe et al. |
| 7,049,163 B1 | 5/2006 | Kao et al. |
| 2002/0168789 A1 | 11/2002 | Wong |
| 2006/0009013 A1 | 1/2006 | Chen et al. |
| 2009/0090915 A1* | 4/2009 | Yamazaki ......... H01L 29/66765 257/66 |

FOREIGN PATENT DOCUMENTS

| CN | 1584718 A | 2/2005 |
| CN | 101150093 A | 3/2008 |
| CN | 101645417 A | 2/2010 |
| CN | 101853809 A | 10/2010 |

(Continued)

*Primary Examiner* — Mohammed R Alam

(57) ABSTRACT

The present disclosure provides a TFT array substrate and a manufacturing method thereof. For the manufacturing method, a source electrode and a drain electrode are formed at first, and then edges of the source electrode and the drain electrode are used as masks to pattern a semiconductor layer to form an amorphous silicon island, which makes edges of the amorphous silicon island flush with the edges of the source electrode and the drain electrode, and completely removes the exposed semiconductor layer outside a metal layer, thereby decreasing photoelectric sensitivity of a TFT device, decreasing a size of the TFT device, and being beneficial for saving layouts and simplifying processes.

15 Claims, 6 Drawing Sheets

(56) References Cited

FOREIGN PATENT DOCUMENTS

| | | | |
|---|---|---|---|
| CN | 102263111 | A | 11/2011 |
| CN | 103229301 | A | 7/2013 |
| CN | 104966720 | A | 10/2015 |
| CN | 105118777 | A | 12/2015 |
| CN | 105140239 | A | 12/2015 |
| CN | 105870058 | A | 8/2016 |
| CN | 108198756 | A | 6/2018 |
| CN | 108649016 | A | 10/2018 |
| CN | 108735819 | A | 11/2018 |
| CN | 109103105 | A | 12/2018 |
| CN | 109494257 | A | 3/2019 |
| CN | 109524356 | A | 3/2019 |
| JP | H08181325 | A | 7/1996 |
| WO | 2016201609 | A1 | 12/2016 |

* cited by examiner

TFT ARRAY SUBSTRATE AND MANUFACTURING METHOD THEREOF

FIELD OF INVENTION

The present disclosure relates to the field of display technologies, and more particularly, to a TFT array substrate and a manufacturing method thereof.

BACKGROUND OF INVENTION

With liquid crystal display panels developing toward big sizes and high resolution, in order to improve display quality of advanced products, backlight intensity of liquid crystal display panels is increased while pixel sizes are continuously reduced. Therefore, a higher requirement for thin film transistors (TFTs) of liquid crystal display panels is requested.

A TFT device is a multilayered thin film structure formed by a plurality of exposure, development, and etching processes. In conventional processes, the TFT device is formed by five masking processes, and in the conventional five masking processes, formation of an amorphous silicon island, a source electrode, and a drain electrode requires using two masking processes for patterning, so a predetermined alignment space between a semiconductor layer and a source/drain electrode metal layer is needed. Moreover, the semiconductor layer needs to protrude a portion outside the source/drain electrode metal layer. However, because the semiconductor layer usually adopts a light-sensitive material, during application of display panels, when refracted or reflected light irradiates to a portion of the semiconductor layer of the TFT device which is exposed outside, it easily causes leakage current of the TFT device to increase and makes holding capacity of pixel voltage weaker.

In summary, it is necessary to provide a new TFT array substrate and a manufacturing method thereof to solve the above technical problem.

Technical problem: the present disclosure provides a TFT array substrate and a manufacturing method thereof to solve the technical problem that a predetermined alignment space between a semiconductor layer and a source/drain electrode metal layer is needed in current TFT array substrate, and when refracted or reflected light irradiates to a portion of a semiconductor layer of a TFT device which is exposed outside, it easily causes leakage current of the TFT device to increase and makes holding capacity of pixel voltage weaker.

SUMMARY OF INVENTION

To solve the above problem, an embodiment of the present disclosure provides technical solutions as follows:

An embodiment of the present disclosure provides a manufacturing method of a TFT array substrate, which comprises following steps:

S10: providing a substrate, forming a first metal layer on the substrate, and patterning the first metal layer by a first masking process to form a gate electrode;

S20: forming a gate insulation layer, a semiconductor layer, and a second metal layer on the gate electrode and the substrate in sequence, and patterning the second metal layer by a second masking process to form a source electrode and a drain electrode, wherein a material of the gate insulation layer is silicon oxide or silicon nitride;

S30: patterning the semiconductor layer by a third masking process to form an amorphous silicon island, wherein edges of the amorphous silicon island are flush with edges of the source electrode and edges of the drain electrode;

S40: forming a passivation layer on the gate insulation layer, the source electrode, and the drain electrode, and patterning the passivation layer by a fourth masking process to form a through-hole; and S50: patterning the passivation layer by a fifth masking process to form a pixel electrode, wherein the pixel electrode is connected to the drain electrode through the through-hole.

According to the manufacturing method of the TFT array substrate provided in an embodiment of the present disclosure, the step S30 comprises following steps:

S301: coating a photoresist material on the semiconductor layer, the source electrode, and the drain electrode;

S302: using the third mask to expose and develop the photoresist material to form a protective layer at least corresponding to a channel region; and S303: etching to remove the semiconductor layer not covered by the protective layer, the source electrode, and the drain electrode.

According to the manufacturing method of the TFT array substrate provided in an embodiment of the present disclosure, wherein the semiconductor layer comprises an amorphous silicon layer and an N+ amorphous silicon layer, and the step S303 further comprises etching to remove the $N^+$ amorphous silicon layer in the channel region to expose the amorphous silicon layer.

According to the manufacturing method of the TFT array substrate provided in an embodiment of the present disclosure, the step S303 comprises following steps:

S3031: using the source electrode and the drain electrode as masks and using a dry etching process to remove the semiconductor layer not covered by the protective layer, the source electrode, and the drain electrode;

S3032: using the dry etching process to remove the protective layer; and

S3033: using the source electrode and the drain electrode as the masks and using the dry etching process to remove the $N^+$ amorphous silicon layer in the channel region.

According to the manufacturing method of the TFT array substrate provided in an embodiment of the present disclosure, wherein a thickness of the removed $N^+$ amorphous silicon layer in the channel region ranges from 100 Å to 500 Å.

According to the manufacturing method of the TFT array substrate provided in an embodiment of the present disclosure, wherein the step S3031, the step S3032, and the step S3033 use the same dry etching process.

According to the manufacturing method of the TFT array substrate provided in an embodiment of the present disclosure, wherein a length of the removed semiconductor layer not covered by the protective layer, the source electrode, and the drain electrode is 1 μm.

According to the manufacturing method of the TFT array substrate provided in an embodiment of the present disclosure, wherein in the step S302, the photoresist material is exposed and developed to form the protective layer, and the protective layer corresponds to the source electrode, the drain electrode, and the channel region.

According to the manufacturing method of the TFT array substrate provided in an embodiment of the present disclosure, wherein the third mask is a halftone mask.

An embodiment of the present disclosure provides a manufacturing method of a TFT array substrate, which comprises following steps:

S10: providing a substrate, forming a first metal layer on the substrate, and patterning the first metal layer by a first masking process to form a gate electrode;

S20: forming a gate insulation layer, a semiconductor layer, and a second metal layer on the gate electrode and the substrate in sequence, and patterning the second metal layer by a second masking process to form a source electrode and a drain electrode;

S30: patterning the semiconductor layer by a third masking process to form an amorphous silicon island, wherein edges of the amorphous silicon island are flush with edges of the source electrode and edges of the drain electrode;

S40: forming a passivation layer on the gate insulation layer, the source electrode, and the drain electrode, and patterning the passivation layer by a fourth masking process to form a through-hole; and S50: patterning the passivation layer by a fifth masking process to form a pixel electrode, wherein the pixel electrode is connected to the drain electrode through the through-hole.

According to the manufacturing method of the TFT array substrate provided in an embodiment of the present disclosure, the step S30 comprises following steps:

S301: coating a photoresist material on the semiconductor layer, the source electrode, and the drain electrode;

S302: using the third mask to expose and develop the photoresist material to form a protective layer at least corresponding to a channel region; and S303: etching to remove the semiconductor layer not covered by the protective layer, the source electrode, and the drain electrode.

According to the manufacturing method of the TFT array substrate provided in an embodiment of the present disclosure, wherein the semiconductor layer comprises an amorphous silicon layer and an $N^+$ amorphous silicon layer, and the step S303 further comprises etching to remove the $N^+$ amorphous silicon layer in the channel region to expose the amorphous silicon layer.

According to the manufacturing method of the TFT array substrate provided in an embodiment of the present disclosure, the step S303 comprises following steps:

S3031: using the source electrode and the drain electrode as masks and using a dry etching process to remove the semiconductor layer not covered by the protective layer, the source electrode, and the drain electrode;

S3032: using the dry etching process to remove the protective layer; and

S3033: using the source electrode and the drain electrode as the masks and using the dry etching process to remove the $N^+$ amorphous silicon layer in the channel region.

According to the manufacturing method of the TFT array substrate provided in an embodiment of the present disclosure, wherein a thickness of the removed $N^+$ amorphous silicon layer in the channel region ranges from 100 Å to 500 Å.

According to the manufacturing method of the TFT array substrate provided in an embodiment of the present disclosure, wherein the step S3031, the step S3032, and the step S3033 use the same dry etching process.

According to the manufacturing method of the TFT array substrate provided in an embodiment of the present disclosure, wherein in the step S302, the photoresist material is exposed and developed to form the protective layer, and the protective layer corresponds to the source electrode, the drain electrode, and the channel region.

According to the manufacturing method of the TFT array substrate provided in an embodiment of the present disclosure, wherein the third mask is a halftone mask.

An embodiment of the present disclosure provides a TFT array substrate which comprises:

a substrate;

a gate electrode disposed on the substrate;

a gate insulation layer covering the gate electrode and the substrate;

an amorphous silicon island disposed on the gate insulation layer;

a source electrode and a drain electrode disposed on the amorphous silicon island, wherein a channel region is disposed between the source electrode and the drain electrode;

a passivation layer disposed on the gate insulation layer, the source electrode, and the drain electrode, wherein the passivation layer is provided with a through-hole; and a pixel electrode disposed on the passivation layer and connected to the drain electrode through the through-hole;

wherein edges of the amorphous silicon island are flush with edges of the source electrode and edges of the drain electrode.

According to the TFT array substrate provided in an embodiment of the present disclosure, wherein the amorphous silicon island comprises an amorphous silicon layer and an $N^+$ amorphous silicon layer, the $N^+$ amorphous silicon layer corresponds to the source electrode and the drain electrode, and the amorphous silicon layer corresponds to the source electrode, the drain electrode, and the channel region.

Beneficial Effect the present disclosure provides a TFT array substrate and a manufacturing method thereof using five masking processes. A source electrode and a drain electrode are formed at first, and then edges of the source electrode and the drain electrode are used as masks to pattern a semiconductor layer to form an amorphous silicon island and to remove tails exposed outside the source electrode and the drain electrode, which makes edges of the amorphous silicon island flush with the edges of the source electrode and the drain electrode, and completely removes the exposed semiconductor layer outside a metal layer, thereby effectively decreasing photoelectric sensitivity of a TFT device and decreasing an area of the amorphous silicon island, thereby further decreasing a size of the TFT device, which is beneficial for saving layouts and simplifying processes at the same time.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
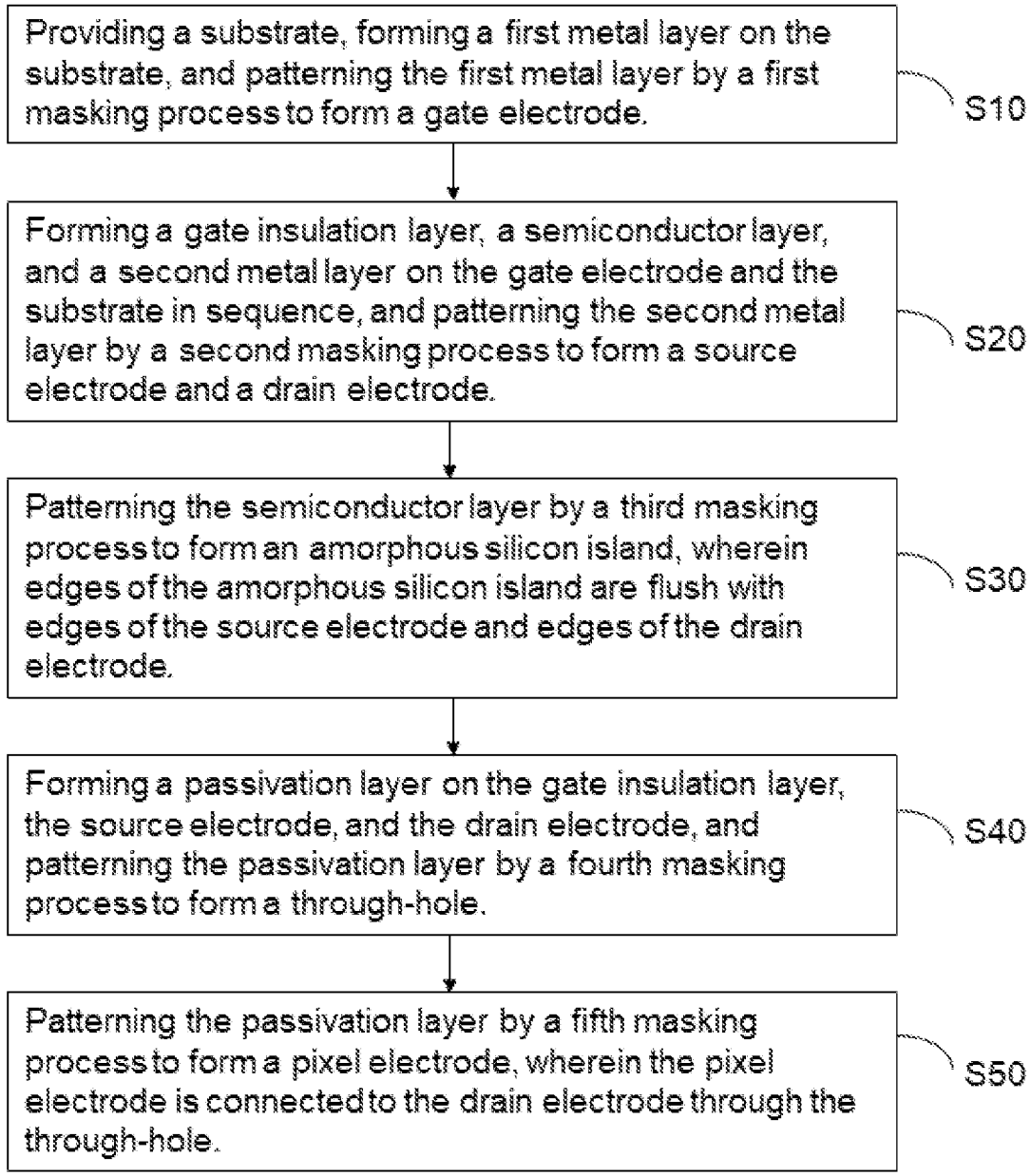
FIG. 1 is a flowchart of a manufacturing method of a TFT array substrate according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper", "lower", "front", "rear", "left", "right", "inside", "outside", "side", as well as derivative thereof should be construed to refer to the orientation as described or shown in the drawings under discussion. These relative terms are for convenience of description, do not require that the present disclosure be constructed or operated in a particular orientation, and shall not be construed as causing limitations to the present disclosure.

For TFT array substrates and manufacturing methods thereof in current technology, an embodiment of the present disclosure can solve the defect that a predetermined alignment space between a semiconductor layer and a source/drain electrode metal layer is needed in current TFT array substrate, and when refracted or reflected light irradiates to a portion of a semiconductor layer of a TFT device which is exposed outside, it easily causes leakage current of the TFT device to increase and makes holding capacity of pixel voltage weaker.

As shown in FIG. 1, a manufacturing method of a TFT array substrate provided by an embodiment of the present disclosure uses five masking processes as examples for description. The manufacturing method comprises following steps:

S10: providing a substrate 10, forming a first metal layer 20 on the substrate 10, and patterning the first metal layer 20 by a first masking process to form a gate electrode 201.

Figure 4A:
FIG. 4A to FIG. 4J are schematic structural diagrams of a TFT array substrate of a manufacturing method of the TFT array substrate according to an embodiment of the present disclosure.
Figure 4B:

Specifically, as shown in FIG. 4A, the first metal layer 20 can be deposited by physical vapor deposition, and a material of the first metal layer 20 can be copper, aluminum, or molybdenum. As shown in FIG. 4B, the first metal layer 20 is exposed, developed, and etched by a first masking process to form the gate electrode 201 on the substrate 10.

S20: forming a gate insulation layer 30, a semiconductor layer 40, and a second metal layer 50 on the gate electrode 201 and the substrate 10 in sequence, and patterning the second metal layer 50 by a second masking process to form a source electrode 501 and a drain electrode 502.

Figure 4C:
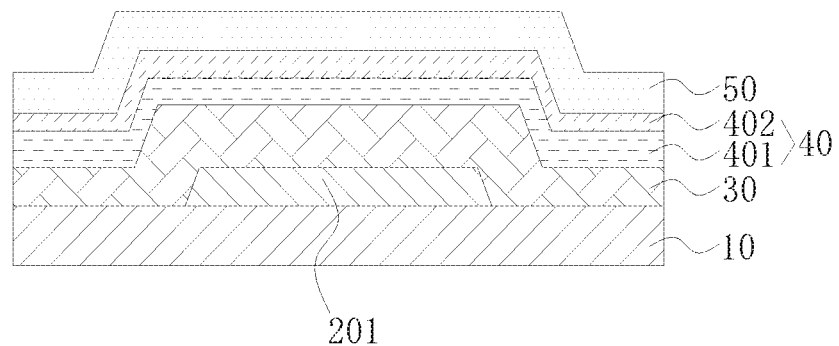

Specifically, as shown in FIG. 4C, the gate insulation layer 30 is deposited on the gate electrode 201 and the substrate 10, the semiconductor layer 40 is deposited on the gate insulation layer 30, and the second metal layer 50 is deposited on the semiconductor layer 40. A material of the gate insulation layer 30 can be silicon oxide or silicon nitride, the semiconductor layer 40 comprises an amorphous silicon layer 401 and an N$^+$ amorphous silicon layer 402 disposed in a stack, the amorphous silicon layer 401 is formed on the gate insulation layer 30, and the N$^+$ amorphous silicon layer 402 is formed on the amorphous silicon layer 401.

Figure 4D:
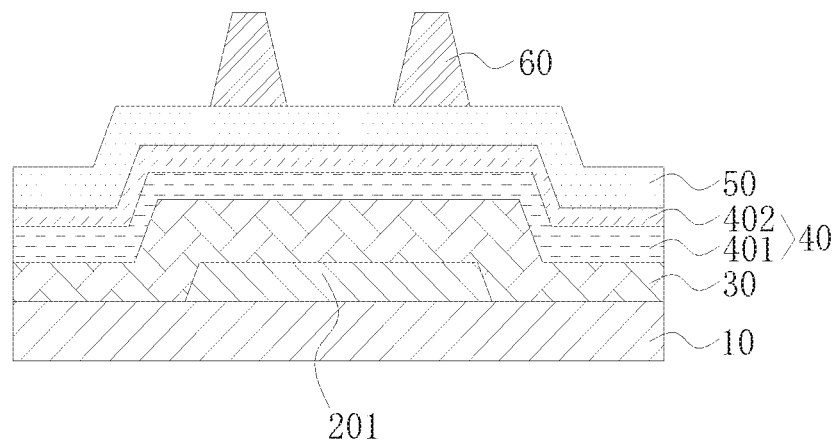

As shown in FIG. 4D, the second metal layer 50 is patterned by the second masking process. A layer of a photoresist material is coated on the second metal layer 50 at first, and then a halftone mask is used to expose and develop the photoresist material to pattern the photoresist material and form a photoresist layer 60 corresponding to the source electrode 501 and the drain electrode 502. After that, the second metal layer 50 is subjected to a wet etching process to form the source electrode 501 and the drain electrode 502. At last, the photoresist layer 60 is removed by a stripping process.

S30: patterning the semiconductor layer 40 by a third masking process to form an amorphous silicon island 40', wherein edges of the amorphous silicon island 40' are flush with edges of the source electrode 501 and edges of the drain electrode 502.

It should be noted that patterning the semiconductor layer 40 to form the amorphous silicon island 40' comprises patterning the amorphous silicon layer 401 and the N$^+$ amorphous silicon layer 402 to remove tails of the amorphous silicon layer 401 and the N$^+$ amorphous silicon layer 402.

Figure 2:
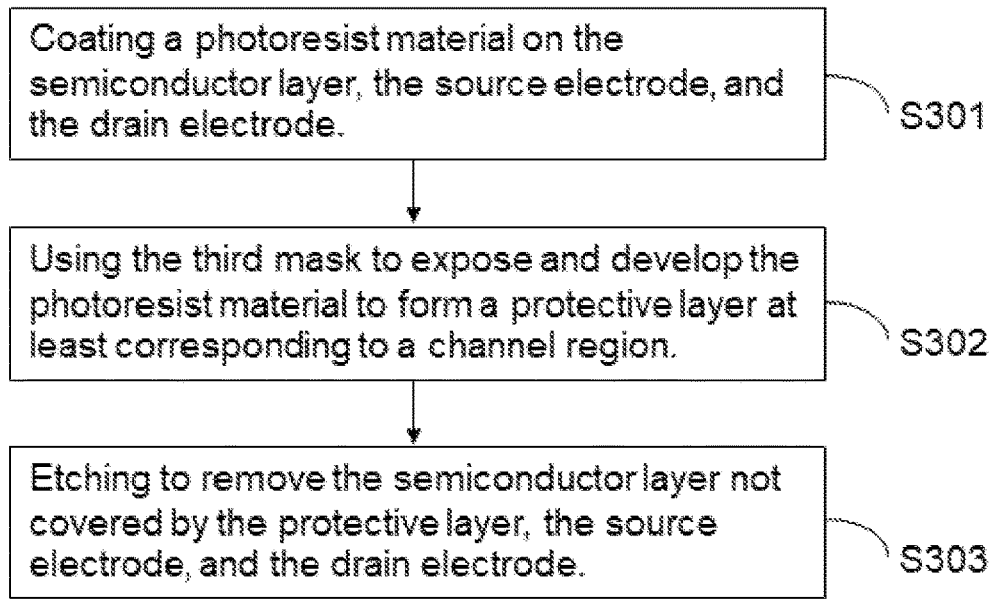
FIG. 2 is a flowchart of a step S30 in a manufacturing method of a TFT array substrate according to an embodiment of the present disclosure.

Specifically, as shown in FIG. 2, the step S30 comprises following steps:

S301: coating a photoresist material on the semiconductor layer 40, the source electrode 501, and the drain electrode 502.

Specifically, the photoresist material used in the third masking process can be the same as that used in the first masking process and the second masking process.

S302: using the third mask to expose and develop the photoresist material to form a protective layer 70 at least corresponding to a channel region 503.

Figure 4E:
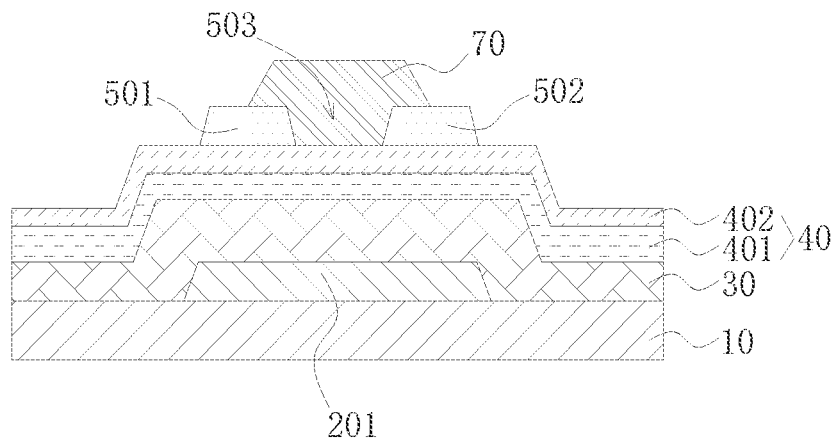

Specifically, as shown in FIG. 4E, the protective layer 70 at least covers the channel region 503 to prevent affecting the channel region 503 in subsequent etching processes.

Further, in the step S302, the photoresist material is exposed and developed to form the protective layer 70, and the protective layer 70 corresponds to the source electrode 501, the drain electrode 502, and the channel region 503.

S303: etching to remove the semiconductor layer 40 not covered by the protective layer 70, the source electrode 501, and the drain electrode 502.

Figure 3:
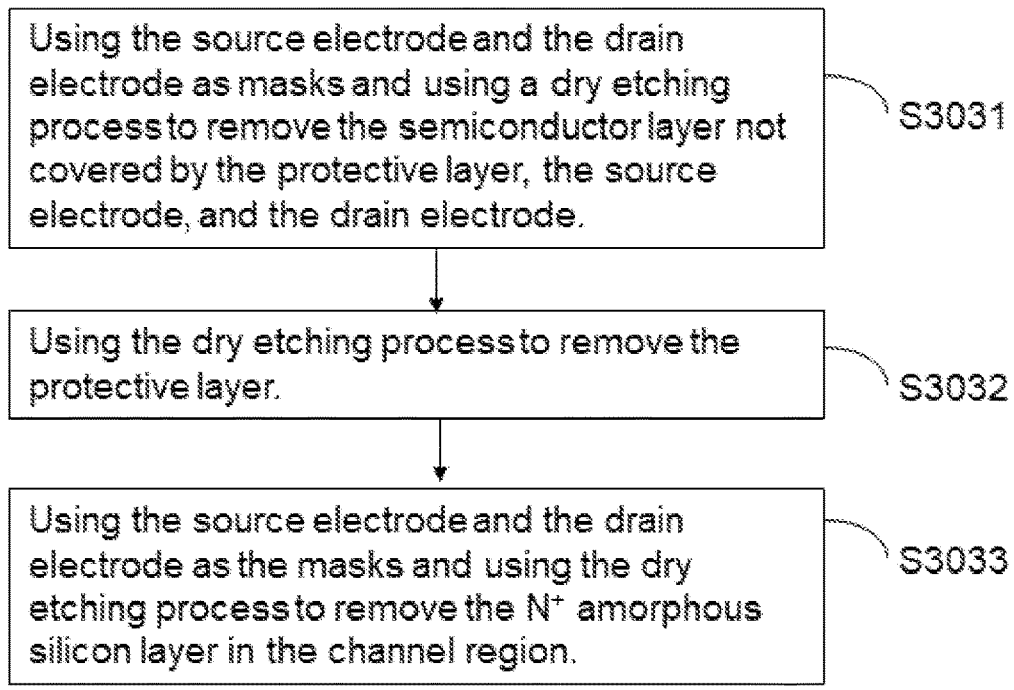
FIG. 3 is a flowchart of a step S303 in a manufacturing method of a TFT array substrate according to an embodiment of the present disclosure.

Specifically, as shown in FIG. 3, the step S303 comprises following steps:

S3031: using the source electrode 501 and the drain electrode 502 as masks and using a dry etching process to remove the semiconductor layer 40 not covered by the protective layer 70, the source electrode 501, and the drain electrode 502.

Figure 4F:
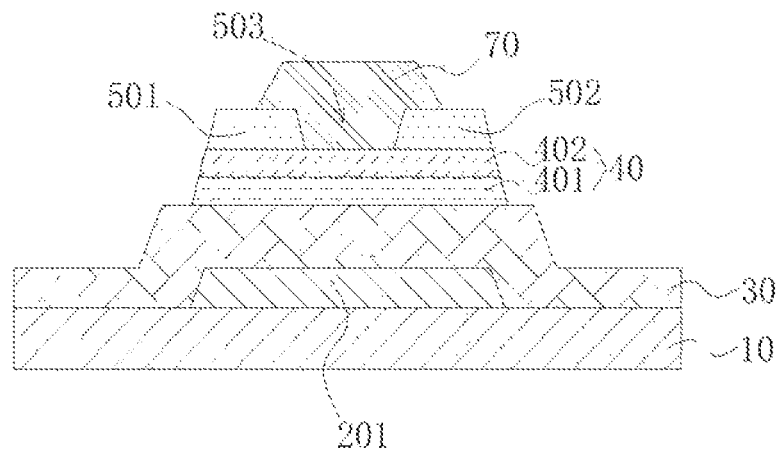

Specifically, as shown in FIG. 4F, the amorphous silicon layer 401 and the N$^+$ amorphous silicon layer 402 on outer sides of the source electrode 501 and the drain electrode 502 are removed at a same time by a dry etching process. The source electrode 501 and the drain electrode 502 are used as masks to make edges of amorphous silicon layer 401 and the N$^+$ amorphous silicon layer 402 flush with outer edges of the source electrode 501 and the drain electrode 502 without needing to consider alignment spaces among the source electrode 501, the drain electrode 502, and the semiconductor layer 40, thereby completely removing amorphous silicon tails and N$^+$ amorphous silicon tails exposed outside the source electrode 501 and the drain electrode 502, preventing the situation of increase in leakage current of the TFT device when refracted or reflected light irradiates to a portion of the semiconductor layer 40 of the TFT device which is exposed outside, and further improving light stability of the TFT device.

Specifically, compared to conventional processes, in the embodiment of the present disclosure, a length of the removed semiconductor layer 40 not covered by the protective layer 70, the source electrode 501, and the drain electrode 502 is 1 μm.

S3032: using the dry etching process to remove the protective layer 70.

Figure 4G:
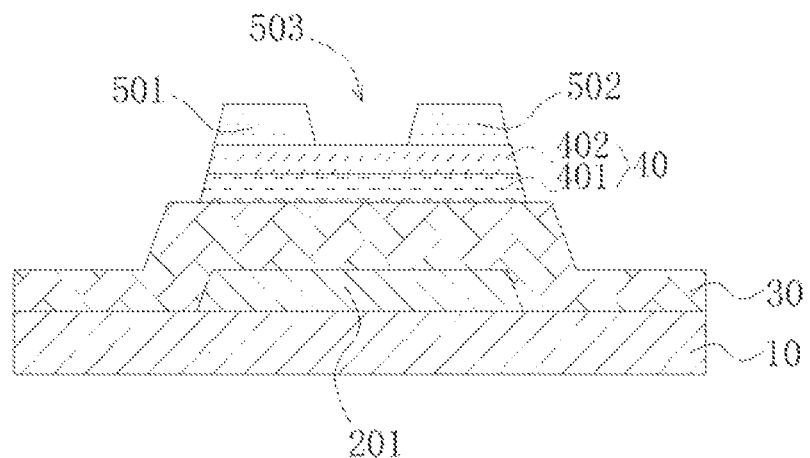

Specifically, as shown in FIG. 4G, the protective layer 70 is removed by the dry etching process.

S3033: using the source electrode 501 and the drain electrode 502 as the masks and using the dry etching process to remove the N$^+$ amorphous silicon layer 402 in the channel region 503.

Figure 4H:
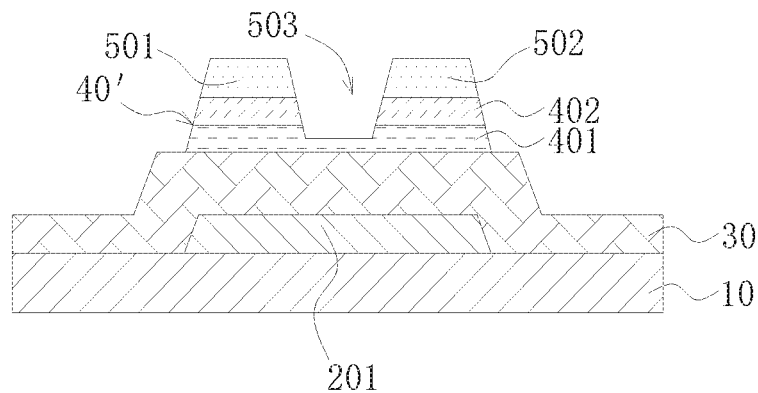

Specifically, as shown in FIG. 4H, the N$^+$ amorphous silicon layer 402 in the channel region 503 is removed by the dry etching process to expose the amorphous silicon layer 401, thereby completely removing the N$^+$ amorphous silicon tails in the channel region 503. A metal area of the source electrode 501 and the drain electrode 502 can be reduced without an N$^+$ amorphous silicon tail structure, which can reduce a size of the TFT device and save layout space.

Wherein, a thickness of the removed N$^+$ amorphous silicon layer 402 in the channel region 503 ranges from 100 Å to 500 Å.

It should be understood that the step S3031, the step S3032, and the step S3033 use the same dry etching process. The embodiment of the present disclosure continuously performs three dry etching processes without other processes inserted, so it can be combined into one process, thereby saving a dry etching process compared to the conventional five masking processes, which simplifies the processes.

S40: forming a passivation layer 80 on the gate insulation layer 30, the source electrode 501, and the drain electrode 502, and patterning the passivation layer 80 by a fourth masking process to form a through-hole 801.

Figure 4I:
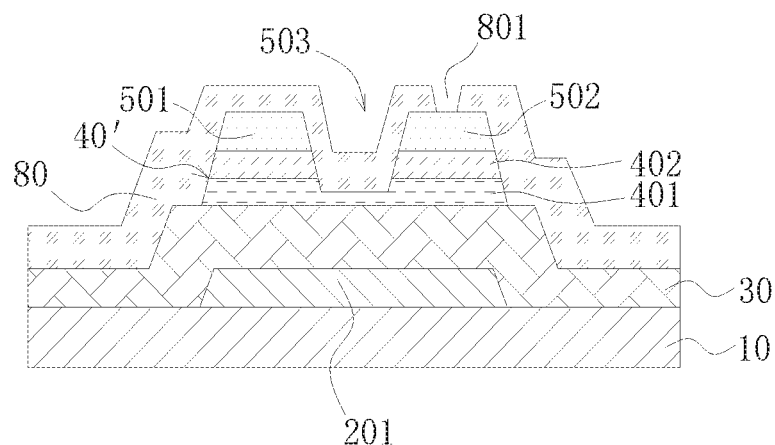

Specifically, as shown in FIG. 4I, the passivation layer 80 can be deposited by physical vapor deposition, and a material of the passivation layer 80 can be oxides, nitrides, or nitrogen oxides. The passivation layer 80 is exposed, developed, and etched by the fourth masking process to form the through-hole 801.

S50: patterning the passivation layer 80 by a fifth masking process to form a pixel electrode 90. Wherein, the pixel electrode 90 is connected to the drain electrode 502 through the through-hole 801.

Figure 4J:
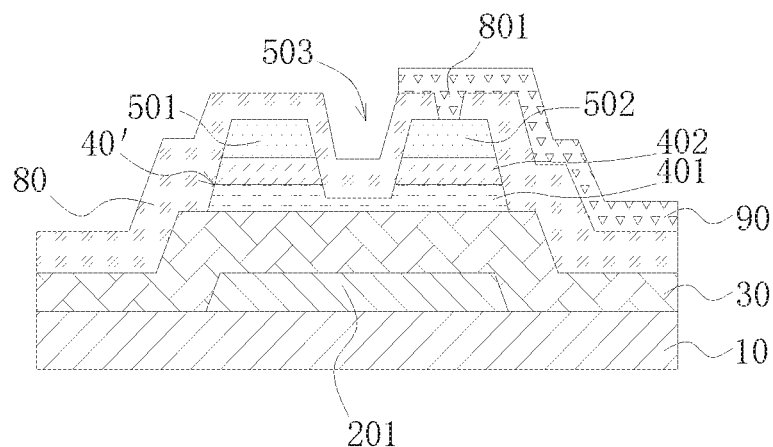

Specifically, as shown in FIG. 4J, after the through-hole is formed, a transparent conductive layer can be deposited by sputtering or thermal evaporation, and then the transparent conductive layer is exposed, developed, and etched by the fifth masking process to form the pixel electrode 90. Wherein, the pixel electrode 90 is connected to the drain electrode 502 through the through-hole 801.

Figure 5:
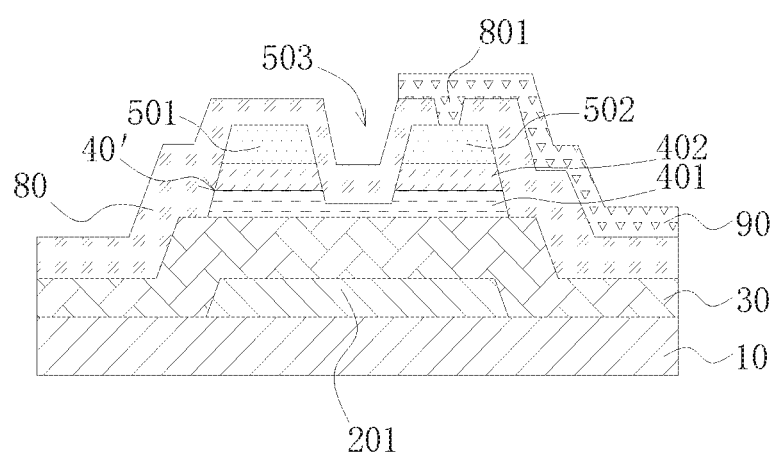
FIG. 5 is a schematic cross-sectional structural diagram of a TFT array substrate according to an embodiment of the present disclosure.

As shown in FIG. 5, an embodiment of the present disclosure provides a TFT array substrate which comprises a substrate 10, a gate electrode 201, a gate insulation layer 30, an amorphous silicon island 40', a source electrode 501, a drain electrode 502, a passivation layer 80, and a pixel electrode 90. Wherein, the gate electrode 201 is disposed on the substrate 10, the gate insulation layer 30 covers the gate electrode 201 and the substrate 10, the amorphous silicon island 40' is disposed on the gate insulation layer 30, the source electrode 501 and the drain electrode 502 are disposed on the amorphous silicon island 40', a channel region 503 is formed between the source electrode 501 and the drain electrode 502, and the passivation layer 80 is disposed on the gate insulation layer 30, the source electrode 501, and the drain electrode 502. The passivation layer 80 is provided with a through-hole 801, the pixel electrode 90 is disposed on the passivation layer 80, and the pixel electrode 90 is connected to the drain electrode 502 through the through-hole 801.

Wherein, edges of the amorphous silicon island 40' are flush with edges of the source electrode 501 and edges of the drain electrode 502.

Specifically, the amorphous silicon island 40' comprises the amorphous silicon layer 401 and the N$^+$ amorphous silicon layer 402, the N$^+$ amorphous silicon layer 402 corresponds to the source electrode 501 and the drain electrode 502, the amorphous silicon layer 401 corresponds to the source electrode 501, the drain electrode 502, and the channel region 503, the amorphous silicon layer 401 is disposed on the substrate 10, and the N$^+$ amorphous silicon layer 402 is disposed on the amorphous silicon layer 401. Because there are no amorphous silicon tails and N$^+$ amorphous silicon tails on the gate insulation layer 30 corresponding to outer sides of the source electrode 501 and the drain electrode 502, and there are no N$^+$ amorphous silicon tails on the amorphous silicon layer 401 corresponding to the channel region 503, the situation of increase in leakage current of the TFT device can be prevented when refracted or reflected light irradiates to a portion of the semiconductor layer 40 of the TFT device which is exposed outside, thereby improving light stability of the TFT device and reducing an area of the amorphous silicon island 40' at the same time, which further reduces a size of the TFT device and is beneficial for saving layouts.

The beneficial effect is that the embodiments of the present disclosure provide a TFT array substrate and a manufacturing method thereof using five masking processes. A source electrode and a drain electrode are formed at first, and then edges of the source electrode and the drain electrode are used as masks to pattern a semiconductor layer to form an amorphous silicon island and to remove tails exposed outside the source electrode and the drain electrode, which makes edges of the amorphous silicon island flush with the edges of the source electrode and the drain electrode, and completely removes the exposed semiconductor layer outside the metal layer, thereby effectively decreasing photoelectric sensitivity of the TFT device and decreasing an area of the amorphous silicon island, thereby further decreasing a size of the TFT device, which is beneficial for saving layouts and simplifying processes at the same time.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A manufacturing method of a thin film transistor (TFT) array substrate, comprising following steps:
    S10: providing a substrate, forming a first metal layer on the substrate, and patterning the first metal layer by a first masking process to form a gate electrode;
    S20: forming a gate insulation layer, a semiconductor layer, and a second metal layer on the gate electrode and the substrate in sequence, and patterning the second metal layer by a second masking process to form a source electrode and a drain electrode, wherein a material of the gate insulation layer is silicon oxide or silicon nitride;

S30: patterning the semiconductor layer by a third masking process to form an amorphous silicon island, wherein edges of the amorphous silicon island are flush with edges of the source electrode and edges of the drain electrode;

S40: forming a passivation layer on the gate insulation layer, the source electrode, and the drain electrode, and patterning the passivation layer by a fourth masking process to form a through-hole; and S50: patterning the passivation layer by a fifth masking process to form a pixel electrode, wherein the pixel electrode is connected to the drain electrode through the through-hole;

wherein the step S30 comprises following steps:

S301: coating a photoresist material on the semiconductor layer, the source electrode, and the drain electrode;

S302: using the third masking process to expose and develop the photoresist material to form a protective layer at least corresponding to a channel region; and S303: etching to remove the semiconductor layer not covered by the protective layer, the source electrode, and the drain electrode.

2. The manufacturing method of the TFT array substrate according to claim 1, wherein the semiconductor layer comprises an amorphous silicon layer and an N+ amorphous silicon layer, and the step S303 further comprises etching to remove the N+ amorphous silicon layer in the channel region to expose the amorphous silicon layer.

3. The manufacturing method of the TFT array substrate according to claim 2, wherein the step S303 comprises following steps:

S3031: using the source electrode and the drain electrode as masks and using a dry etching process to remove the semiconductor layer not covered by the protective layer, the source electrode, and the drain electrode;

S3032: using the dry etching process to remove the protective layer; and

S3033: using the source electrode and the drain electrode as the masks and using the dry etching process to remove the N+ amorphous silicon layer in the channel region.

4. The manufacturing method of the TFT array substrate according to claim 3, wherein a thickness of the removed N+ amorphous silicon layer in the channel region ranges from 100 Å to 500 Å.

5. The manufacturing method of the TFT array substrate according to claim 3, wherein the step S3031, the step S3032, and the step S3033 use the same dry etching process.

6. The manufacturing method of the TFT array substrate according to claim 3, wherein a length of the removed semiconductor layer not covered by the protective layer, the source electrode, and the drain electrode is 1 µm.

7. The manufacturing method of the TFT array substrate according to claim 1, wherein in the step S302, the photoresist material is exposed and developed to form the protective layer, and the protective layer corresponds to the source electrode, the drain electrode, and the channel region.

8. The manufacturing method of the TFT array substrate according to claim 1, wherein a mask in the third masking process is a halftone mask.

9. A manufacturing method of a thin film transistor (TFT) array substrate, comprising following steps:

S10: providing a substrate, forming a first metal layer on the substrate, and patterning the first metal layer by a first masking process to form a gate electrode;

S20: forming a gate insulation layer, a semiconductor layer, and a second metal layer on the gate electrode and the substrate in sequence, and patterning the second metal layer by a second masking process to form a source electrode and a drain electrode;

S30: patterning the semiconductor layer by a third masking process to form an amorphous silicon island, wherein edges of the amorphous silicon island are flush with edges of the source electrode and edges of the drain electrode;

S40: forming a passivation layer on the gate insulation layer, the source electrode, and the drain electrode, and patterning the passivation layer by a fourth masking process to form a through-hole; and S50: patterning the passivation layer by a fifth masking process to form a pixel electrode, wherein the pixel electrode is connected to the drain electrode through the through-hole;

wherein the step S30 comprises following steps:

S301: coating a photoresist material on the semiconductor layer, the source electrode, and the drain electrode;

S302: using the third masking process to expose and develop the photoresist material to form a protective layer at least corresponding to a channel region; and S303: etching to remove the semiconductor layer not covered by the protective layer, the source electrode, and the drain electrode.

10. The manufacturing method of the TFT array substrate according to claim 9, wherein the semiconductor layer comprises an amorphous silicon layer and an N+ amorphous silicon layer, and the step S303 further comprises etching to remove the N+ amorphous silicon layer in the channel region to expose the amorphous silicon layer.

11. The manufacturing method of the TFT array substrate according to claim 10, wherein the step S303 comprises following steps:

S3031: using the source electrode and the drain electrode as masks and using a dry etching process to remove the semiconductor layer not covered by the protective layer, the source electrode, and the drain electrode;

S3032: using the dry etching process to remove the protective layer; and

S3033: using the source electrode and the drain electrode as the masks and using the dry etching process to remove the N+ amorphous silicon layer in the channel region.

12. The manufacturing method of the TFT array substrate according to claim 11, wherein a thickness of the removed N+ amorphous silicon layer in the channel region ranges from 100 Å to 500 Å.

13. The manufacturing method of the TFT array substrate according to claim 11, wherein the step S3031, the step S3032, and the step S3033 use the same dry etching process.

14. The manufacturing method of the TFT array substrate according to claim 9, wherein in the step S302, the photoresist material is exposed and developed to form the protective layer, and the protective layer corresponds to the source electrode, the drain electrode, and the channel region.

15. The manufacturing method of the TFT array substrate according to claim 9, wherein a mask in the third masking process is a halftone mask.

* * * * *